US012616062B2

(12) United States Patent
Kim et al.

(10) Patent No.: US 12,616,062 B2
(45) Date of Patent: Apr. 28, 2026

(54) DEVICE ASSEMBLY, DEVICE MODULE INCLUDING THE DEVICE ASSEMBLY, AND DEVICE PACKAGE INCLUDING THE DEVICE MODULE

(71) Applicants: KOREA INSTITUTE OF SCIENCE AND TECHNOLOGY, Seoul (KR); RESEARCH & BUSINESS FOUNDATION SUNGKYUNKWAN UNIVERSITY, Suwon-si (KR)

(72) Inventors: In Soo Kim, Seoul (KR); Donghee Son, Suwon-si (KR); Hannah Kwon, Seoul (KR); Hye Jun Kim, Seoul (KR); Duhwan Seong, Suwon-si (KR); Jinhyun Kim, Seoul (KR)

(73) Assignees: KOREA INSTITUTE OF SCIENCE AND TECHNOLOGY, Seoul (KR); RESEARCH & BUSINESS FOUNDATION SUNGKYUNKWAN UNIVERSITY, Suwon-si (KR)

( * ) Notice: Subject to any disclaimer, the term of this patent is extended or adjusted under 35 U.S.C. 154(b) by 898 days.

(21) Appl. No.: 17/893,016

(22) Filed: Aug. 22, 2022

(65) Prior Publication Data

US 2023/0066491 A1    Mar. 2, 2023

(30) Foreign Application Priority Data

Aug. 25, 2021    (KR) ........................ 10-2021-0112178

(51) Int. Cl.
*H10W 90/00*        (2026.01)
*H10K 50/844*       (2023.01)

(52) U.S. Cl.
CPC .......... *H10W 90/00* (2026.01); *H10K 50/844* (2023.02)

(58) Field of Classification Search
CPC ........................... H01L 25/165; H01L 25/167
See application file for complete search history.

(56) References Cited

U.S. PATENT DOCUMENTS

2020/0401223 A1 * 12/2020 Seo ........................ H05K 1/028
2021/0165133 A1    6/2021 Lee

FOREIGN PATENT DOCUMENTS

KR    10-2012-0003717 A    1/2012
KR    10-2021-0067291 A    6/2021
KR    10-2021-0090954 A    7/2021

* cited by examiner

*Primary Examiner* — Catherine A. Simone

(57) ABSTRACT

Provided is a device assembly including a substrate for mounting a device thereon, electrodes provided on the substrate to be electrically connected to the device, and an encapsulation provided on the substrate and the electrodes to accommodate and encapsulate the device therein, wherein the substrate and the encapsulation are made of a self-healing polymer (SHP), and wherein the electrodes are made of a conductive polymer composite including the SHP.

5 Claims, 3 Drawing Sheets

DEVICE ASSEMBLY, DEVICE MODULE INCLUDING THE DEVICE ASSEMBLY, AND DEVICE PACKAGE INCLUDING THE DEVICE MODULE

CROSS-REFERENCE TO RELATED PATENT APPLICATION

This application claims the benefit of Korean Patent Application No. 10-2021-0112178, filed on Aug. 25, 2021, in the Korean Intellectual Property Office, the disclosure of which is incorporated herein in its entirety by reference.

BACKGROUND OF THE INVENTION

1. Field of the Invention

The present invention relates to a device assembly, a device module including the device assembly, and a device package including the device module and, more particularly, to a device assembly including a self-healing polymer (SHP) encapsulation, a device module including the device assembly, and a device package including the device module.

2. Description of the Related Art

The development of new and renewable energy is required in preparation for rapidly increasing demand for energy and greenhouse gas reduction policies in the future. Solar cells for converting infinite and clean solar energy into electrical energy have drawn much attention, but may not be easily used as a main source of electricity due to high power generation costs. Therefore, low-cost and high-efficiency solar cells have been actively developed, and representative examples thereof include dye-sensitized solar cells, organic solar cells, quantum dot solar cells, and perovskite solar cells, which are called next-generation solar cells. Among them, perovskite solar cells are the most popular solar cells in recent years. Perovskite refers to a crystalline structure having a composition of $AMX_3$. A perovskite material including organic cations such as methylammonium, formamidinium, or $Cs^+$ at A sites, $Pb^{2+}$ at M sites, and halide ions ($Bi^-$, $I^-$) at X sites is the most commonly used composition for solar cells at present. A perovskite halide has excellent properties as a light absorber for solar cells.

However, due to the sensitivity to moisture and oxygen, perovskite may be easily damaged and thus cause performance degradation. In addition, there is an issue of harmfulness of lead (Pb) included in the perovskite halide used for the light absorption layer. The leakage of Pb is very harmful not only to the environment but also to the human bodies and thus the commercialization of perovskite solar cells may cause various side effects.

As such, to seal perovskite from the outside or to prevent the leakage of Pb from the light absorption layer, a glass encapsulation such as a passivation layer is generally used to encapsulate solar cells. However, such a glass-based device assembly may not be easily implemented as a flexible or stretchable device due to the difficulty of structural transformation, and may not prevent the leakage of Pb due to the absence of means to repair damage to the glass part.

SUMMARY OF THE INVENTION

The present invention provides a device assembly capable of achieving operation stability and minimizing leakage of lead (Pb) from a device by using a self-healing polymer (SHP) encapsulation, a device module including the device assembly, and a device package including the device module. However, the scope of the present invention is not limited thereto.

According to an aspect of the present invention, there is provided a device assembly including a substrate for mounting a device thereon, electrodes provided on the substrate to be electrically connected to the device, and an encapsulation provided on the substrate and the electrodes to accommodate and encapsulate the device therein, wherein the substrate and the encapsulation are made of a self-healing polymer (SHP), and wherein the electrodes are made of a conductive polymer composite including the SHP.

The substrate, the electrodes, and the encapsulation may be provided in close contact with each other.

The electrodes may include a first electrode provided at an end of the substrate and extending to be in contact with the device, and a second electrode provided at another end of the substrate.

The first electrode may be bent upward and extend to be in contact with an upper surface of the device.

The conductive polymer composite may include a matrix provided as the SHP, and a plurality of electrical conductor clusters dispersed in the matrix, and the electrical conductor clusters may include a metal material including one or more of silver (Ag), gold (Au), copper (Cu), aluminum (Al), tungsten (W), molybdenum (Mo), titanium (Ti), chromium (Cr), nickel (Ni), and platinum (Pt).

According to another aspect of the present invention, there is provided a device module in which a plurality of unit modules each provided as the above-described device assembly are connected in series.

The unit modules may include a first unit module provided as the device assembly including a light-receiving device as the device, and a second unit module provided as the device assembly including a light-emitting device as the device, and the second unit module may be driven by electrical energy generated from the first unit module.

According to still another aspect of the present invention, there is provided a device package including a mounting part for mounting the above-described device module thereon, and a case provided on the mounting part to accommodate and encapsulate the device module therein, wherein the mounting part and the case are made of a self-healing polymer (SHP).

BRIEF DESCRIPTION OF THE DRAWINGS

The above and other features and advantages of the present invention will become more apparent by describing in detail embodiments thereof with reference to the attached drawings in which.

DETAILED DESCRIPTION OF THE INVENTION

Figure 1:
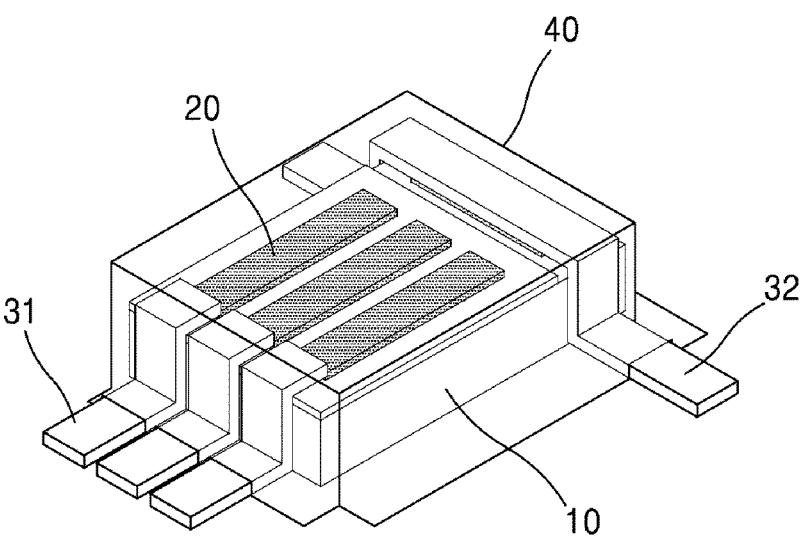
FIG. 1 is a perspective view of a device assembly according to an embodiment of the present invention.

Hereinafter, the present invention will be described in detail by explaining embodiments of the invention with reference to the attached drawings. The invention may, however, be embodied in many different forms and should not be construed as being limited to the embodiments set forth herein; rather, these embodiments are provided so that this disclosure will be thorough and complete, and will fully convey the concept of the invention to one of ordinary skill in the art. In the drawings, the sizes of elements may be exaggerated or reduced for convenience of explanation.

FIG. 1 is a perspective view of a device assembly according to an embodiment of the present invention.

Referring to FIG. 1, the device assembly according to an embodiment of the present invention includes a substrate 10 for mounting a device thereon, electrodes provided on the substrate to be electrically connected to the device 20, and an encapsulation 40 provided on the substrate 10 and the electrodes to accommodate and encapsulate the device 20 therein. In this case, the substrate 10 and the encapsulation 40 are made of a self-healing polymer (SHP), and the electrodes are made of a conductive polymer composite including the SHP. The conductive polymer composite includes a matrix provided as the SHP used for the substrate and the encapsulation, and electrical conductor particles dispersed in the matrix.

The SHP used for the substrate 10 and the encapsulation 40, according to an embodiment of the present invention, refers to a polymer which has an ability to autonomously repair internal damage and recover to an undamaged state. Such a polymer includes an elastomer having, as a backbone, polydimethylsiloxane (PDMS), polyethylene oxide (PEO), perfluoropolyether (PFPE), polybutylene (PB), poly (ethylene-co-1-butylene), poly (butadiene), hydrogenated poly (butadiene), poly (ethylene oxide)-polypropylene oxide) block copolymer or random copolymer, or poly (hydroxyalkanoate). The SHP may be produced by adding a precursor or a new unit to the elastomer having the above-mentioned material as a backbone. As an example of the elastomer having PDMS as a backbone, PDMS-4,4'-methylenebis (phenyl urea) (MPU) 0.4-isophorone bisurea units (IU) 0.6 may be used as the SHP.

The conductive polymer composite used for the electrodes, according to an embodiment of the present invention, has a structure in which electrical conductor particles are dispersed in the SHP, and the electrical conductor particles correspond to an element for allowing the conductive polymer composite to have electrical conductivity. In addition, when the conductive polymer composite is greatly deformed by an external force, the conductive particles are dynamically rearranged to recover the electrical conductivity.

The electrical conductor dispersed in the conductive polymer composite are characterized in that particles of the same material with different sizes are provided close to each other to form clusters. For convenience of explanation, large-sized particles are called first electrical conductor particles, and small-sized particles are called second electrical conductor particles. For example, the first electrical conductor particles may have a size range of 500 nm to 2 μm, and the second electrical conductor particles have a size range of 50 nm or less (and greater than 0). The electrical conductor particles may representatively include metal particles. The metal may include metals having high electrical conductivity, e.g., silver (Ag), gold (Au), copper (Cu), and aluminum (Al). In addition, the metal may include tungsten (W), molybdenum (Mo), titanium (Ti), chromium (Cr), nickel (Ni), and platinum (Pt). The metal particles may be produced using a wet method or powder metallurgy, and have various shapes based on a production method or a grinding method. For example, the metal particles may have a spherical shape, a flake shape, a plate shape, a fiber shape, or a wire shape, or have an irregular shape which may not be specified.

The substrate 10 and the encapsulation 40, and the electrodes, according to an embodiment of the present invention, are made of SHP-based homogeneous materials, and are provided in close contact with each other. Specifically, surfaces of the electrodes in contact with the substrate 10, e.g., lower surfaces of the electrodes, may be in close contact with an upper surface or side surfaces of the substrate 10. In addition, a surface of the encapsulation 40 in contact with the substrate 10 and the electrodes, e.g., a lower surface of the encapsulation 40, may be provided in close contact with upper surfaces of the electrodes or side surfaces of the substrate 10. Due to the close contact between the elements in the vicinity of the device, the device assembly according to an embodiment of the present invention may excellently seal the device 20 accommodated in the encapsulation 40.

Meanwhile, the electrodes according to an embodiment of the present invention may include a first electrode 31 provided at an end of the substrate and extending to be in contact with the device 20, and a second electrode 32 provided at another end of the substrate 10.

Specifically, the first electrode 31 may be bent upward and extend from the end of the substrate 10 toward an upper surface of the device 20 so as to be in direct contact with the upper surface of the device 20 mounted on the substrate 10.

The device 20 according to an embodiment of the present invention may be, for example, a light-receiving device or a light-emitting device. Alternatively, the device according to an embodiment of the present invention may be, for example, a general electronic device such as a resistor, an inductor, a capacitor, a diode, or a transistor. The light-receiving device is a device for converting light energy into electrical energy and may be, for example, a solar cell, and more specifically, a perovskite solar cell. The light-emitting device is a device for converting electrical energy into light energy to emit light and may be, for example, a light-emitting diode (LED).

A test example of the present invention will now be described. However, the following test example is merely for better understanding of the present invention, and the present invention is not limited thereto.

Test Example

In the test example, the substrate and the encapsulation were formed by selecting PDMS-4,4'-methylenebis(phenyl urea) (MPU) 0.4-isophorone bisurea units (IU) 0.6 as the SHP, and the electrodes were formed by producing the conductive polymer composite by selecting flake-shaped Ag particles as the electrical conductor particles dispersed in the SHP serving as a matrix, thereby manufacturing the device assembly according to an embodiment of the present invention.

Figure 2:
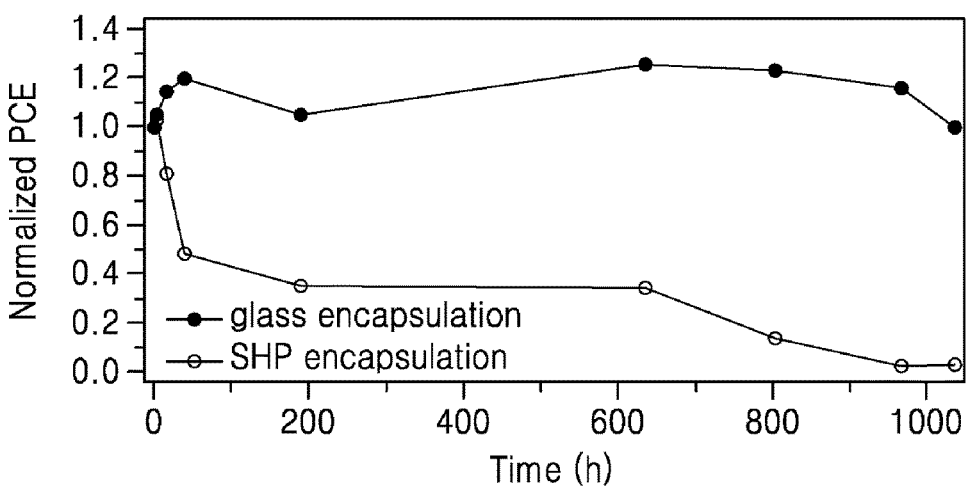
FIG. 2 is a graph showing changes in device performance of a device assembly according to the present invention and a general device assembly over time.

FIG. 2 is a graph showing changes in device performance of a device assembly according to the present invention and a general device assembly over time. Specifically, changes in average power conversion efficiency (PCE) of the device assembly of the present invention which includes the SHP encapsulation produced as described above, and the general device assembly which includes a general glass encapsulation are shown. The PCE indicates the efficiency of generating electricity when light is received.

Referring to FIG. 2, the PCE of the general device assembly is rapidly reduced over time, but the PCE of the device assembly according to the present invention is constantly maintained as time passes.

It may be understood that the degradation of the general device assembly over time is because the general glass encapsulation structure may not perfectly seal the device. The device, e.g., a perovskite solar cell, is sensitive to an external environment such as moisture or oxygen, and thus degradation may occur when the device is damaged due to exposure to the external environment. That is, when a glass layer is damaged, because the damage may not be repaired, the device may be unavoidably exposed to the external environment for a long time and moisture or oxygen of the external environment may permeate anytime into a gap between the glass layer and the substrate thereunder, which are heterogeneous materials, due to a failure in close contact between the two elements.

The encapsulation according to an embodiment of the present invention may not only suppress permeation of external moisture and oxygen because it is a SHP-based hydrophobic material, but also perfectly block and seal the device accommodated therein from the external environment because it may be in close contact with the substrate and the electrodes which are SHP-based homogeneous materials like the encapsulation. In addition, because close contact between homogeneous materials may be easily achieved merely through adhesion, the above-described sealing function may be enabled merely through simple adhesion between the encapsulation, the substrate, and the electrodes.

Meanwhile, an insulating layer may be additionally provided on the encapsulation according to an embodiment of the present invention. In this case, the insulating layer may be deposited on the encapsulation to a certain thickness by using, for example, atomic layer deposition (ALD). Due to the insulating layer, the encapsulation according to an embodiment of the present invention may have high diffusion resistance against impurities and have physical and chemical stability against the external environment, thereby increasing operation stability of the device accommodated therein.

Figure 3:
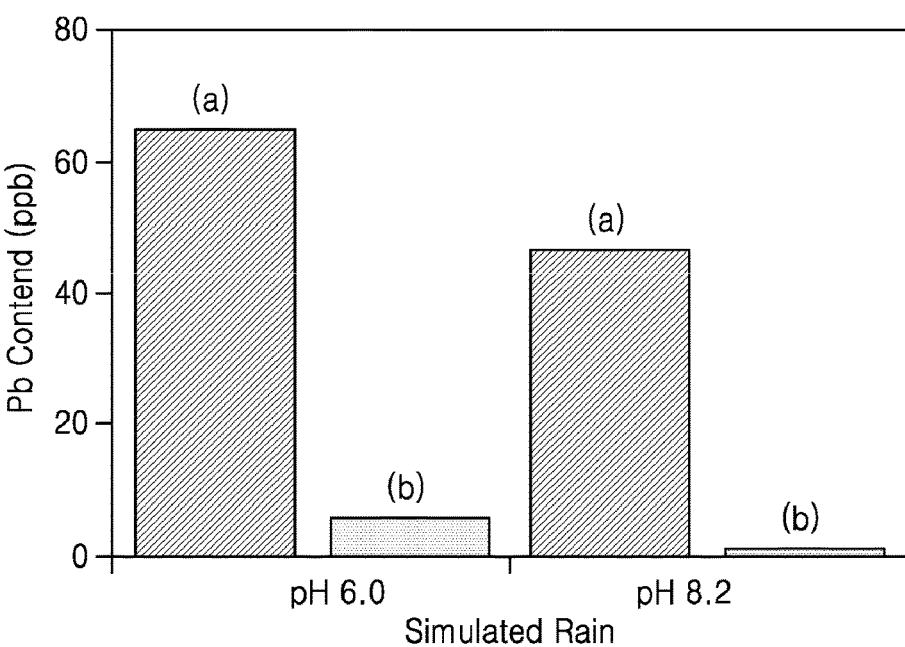
FIG. 3 is a graph showing amounts of lead (Pb) leaked from a device assembly according to the present invention and a general device assembly.

FIG. 3 is a graph showing amounts of lead (Pb) leaked from a device assembly according to the present invention and a general device assembly. Specifically, the device assembly according to the present invention with a damaged SHP encapsulation and the general device assembly with a damaged glass encapsulation are put in water for a certain time and then the amounts of Pb leaked into the water are measured.

Referring to FIG. 3, a large amount of Pb is leaked from the damaged encapsulation of the general device assembly, but almost no Pb is leaked from the device assembly according to the present invention. That is, when damaged, the SHP encapsulation according to an embodiment of the present invention may rapidly recover from the damage due to its self-healing ability, and thus minimize the leakage of the Pb component.

A device module according to another embodiment of the present invention has a structure in which a plurality of unit modules each provided as the device assembly according to the present invention are connected in series. To electrically connect the plurality of unit modules, for example, electrodes of neighboring unit modules may be provided in contact with each other.

The unit modules may include a first unit module provided as the device assembly including a light-receiving device as the device, and a second unit module provided as the device assembly including a light-emitting device as the device. The second unit module may be driven by electrical energy generated from the first unit module which is electrically connected in series thereto, thereby generating light energy and emitting light.

Figure 4A:
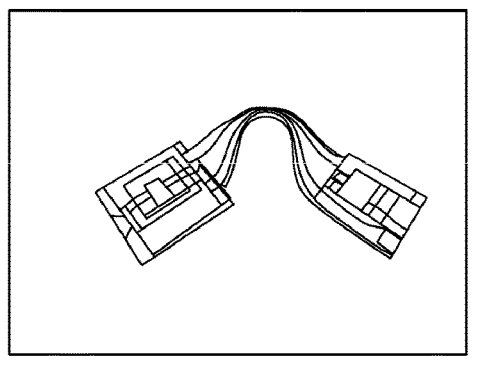
FIGS. 4A and 4B include images showing structures and operations of a device module according to another embodiment of the present invention.
Figure 4A:
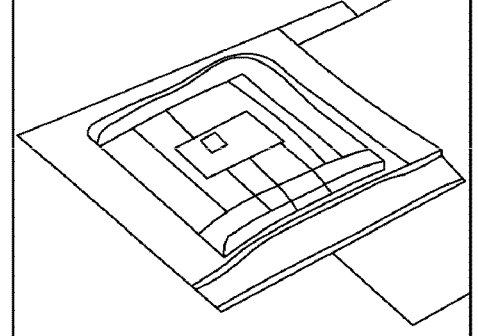
Figure 4B:
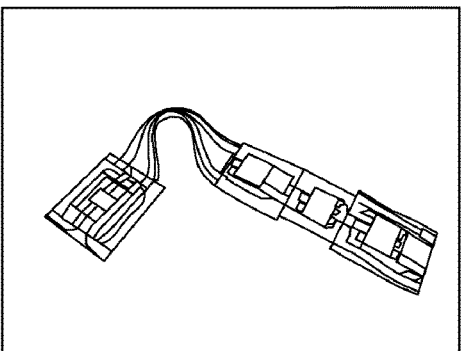
Figure 4B:
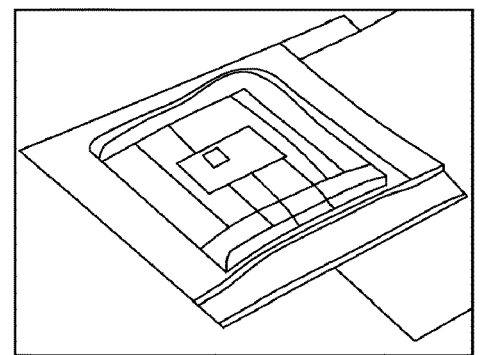
Figure 5:
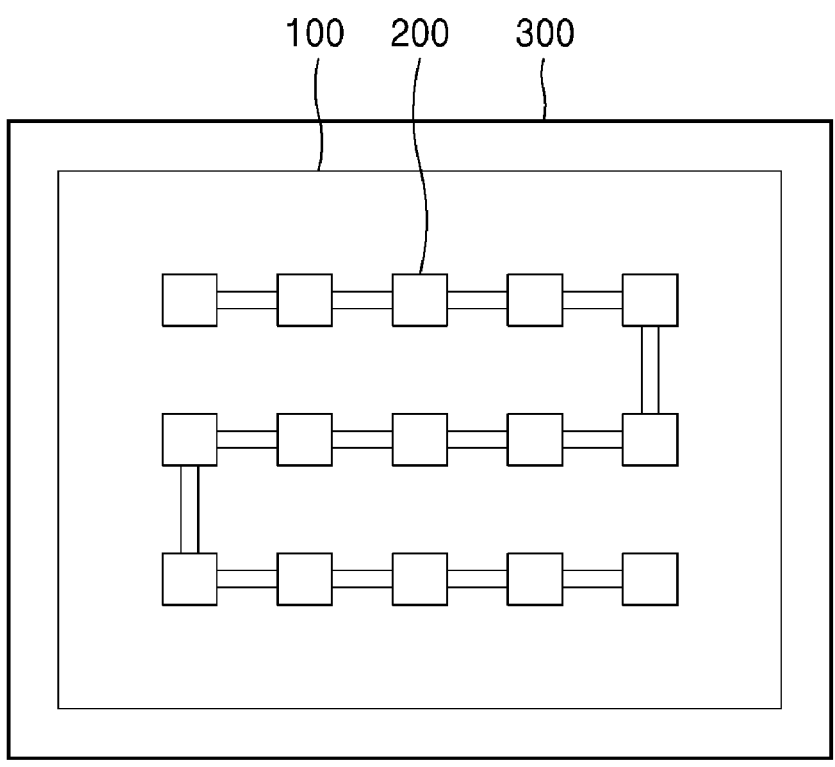
FIG. 5 is a plan view of a device package according to still another embodiment of the present invention.

FIG. 4A includes images showing a structure and operation of a device module according to another embodiment of the present invention. FIG. 4A shows a structure of a device module in which one first unit module and one second unit module are connected in series, and shows that the second unit module is driven by the single first unit module to generate light. In this case, the first unit module may include, for example, a perovskite solar cell, and the second unit module may include, for example, a LED. FIG. 4B shows a structure of a device module in which three first unit modules and one second unit module are connected in series, and shows that the second unit module is driven by the three first unit modules to generate light. Comparatively referring to FIGS. 4A and 4B, it is shown that the intensity of emitted light increases when the number of first unit modules connected to the second unit module increases. That is, the number of first unit modules is proportional to the intensity of emitted light, and it may be understood that this result is because electrical energy supplied to the second unit module increases when the number of first unit modules increases, FIG. 5 is a plan view of a device package according to still another embodiment of the present invention. Referring to FIG. 5, the device package according to still another embodiment of the present invention may include a mounting part 100 for mounting the device module 200 according to the present invention thereon, and a case 300 provided on the mounting part 100 to accommodate and encapsulate the device module 200 therein, and the mounting part 100 and the case 300 may be made of a SHP. That is, the device package according to still another embodiment of the present invention may be provided to encapsulate the device module 200 including a plurality of unit modules.

The mounting part and the case according to an embodiment of the present invention are made of SHP-based homogeneous materials, and are provided in close contact with each other. That is, a surface of the case in contact with the mounting part, e.g., a lower surface of the case, may be in close contact with an upper surface or side surfaces of the mounting part, Due to the close contact between the elements in the vicinity of the device module, the device package according to still another embodiment of the present invention may excellently seal the device module accommodated in the mounting part.

As described above, according to an embodiment of the present invention, a device assembly capable of sealing a device as much as possible from external moisture and oxygen merely through simple adhesion by using a SHP, a device module including the device assembly, and a device package including the device module may be provided.

In addition, a device assembly capable of stable operation, a device module including the device assembly; and a device package including the device module may be provided.

Furthermore, a device assembly capable of minimizing leakage of a harmful material from a light absorption layer even when an external impact is applied, a device module including the device assembly, and a device package including the device module may be provided. However, the scope of the present invention is not limited to the above-described effects.

While the present invention has been particularly shown and described with reference to embodiments thereof, it will be understood by one of ordinary skill in the art that various changes in form and details may be made therein without departing from the scope of the present invention as defined by the following claims.

What is claimed is:

1. A device assembly comprising:

a substrate on which a device is mounted;

electrodes provided on the substrate and electrically connected to the device; and an encapsulation provided on the substrate, the device, and the electrodes, the encapsulation covering the device to accommodate and encapsulate the device therein, wherein the substrate and the encapsulation are made of a self-healing polymer (SHP), wherein the electrodes are made of a conductive polymer composite comprising the SHP, and wherein the device includes a light-receiving device, or a light-emitting device, or both.

2. The device assembly of claim 1, wherein the substrate, the electrodes, and the encapsulation are provided in close contact with each other.

3. The device assembly of claim 1, wherein the electrodes comprise:

a first electrode provided at an end of the substrate and extending to be in contact with the device; and a second electrode provided at another end of the substrate.

4. The device assembly of claim 3, wherein the first electrode is bent upward and extends to be in contact with an upper surface of the device.

5. The device assembly of claim 1, wherein the conductive polymer composite comprises:

a matrix provided as the SHP; and a plurality of electrical conductor clusters dispersed in the matrix, and wherein the electrical conductor clusters comprise a metal material comprising one or more of silver (Ag), gold (Au), copper (Cu), aluminum (Al), tungsten (W), molybdenum (Mo), titanium (Ti), chromium (Cr), nickel (Ni), and platinum (Pt).

* * * * *